United States Patent
Dixon et al.

(10) Patent No.: US 7,610,077 B2
(45) Date of Patent: Oct. 27, 2009

(54) QUANTITATION OF SAMPLE PROPERTIES USING CONTRAST ENHANCEMENT FROM SATURATION TRANSFER

(75) Inventors: W. Thomas Dixon, Clifton Park, NY (US); Ileana Hancu, Clifton Park, NY (US)

(73) Assignee: General Electric Compnay, Niskayuna, NY (US)

( * ) Notice: Subject to any disclaimer, the term of this patent is extended or adjusted under 35 U.S.C. 154(b) by 649 days.

(21) Appl. No.: 11/297,263

(22) Filed: Dec. 8, 2005

(65) Prior Publication Data

US 2007/0134159 A1  Jun. 14, 2007

(51) Int. Cl.
*A61B 5/055* (2006.01)
(52) U.S. Cl. .................. 600/420; 324/307; 324/309
(58) Field of Classification Search .............. 600/407, 600/410, 420; 424/9.3; 324/307, 309
See application file for complete search history.

(56) References Cited

U.S. PATENT DOCUMENTS

2005/0059881 A1* 3/2005 Balaban et al. ............. 600/420
2005/0191243 A1   9/2005 Aime et al.

\* cited by examiner

*Primary Examiner*—Ruth S Smith
*Assistant Examiner*—Christopher Cook
(74) *Attorney, Agent, or Firm*—Eileen Walsh Gallagher

(57) ABSTRACT

The manipulation of RF irradiation to a subject in which a CEST agent has been administered is employed to determine a biological parameter in vivo in conjunction with an MRI imaging process. The exchange rate of the CEST agent is determined through RF manipulation which in turn enables the determination of a biological parameter through standard calibration techniques. The exchange rate of CEST agents is modulated as a function of many biological parameters, such as pH. MRI apparatuses and computer program products configured for determining exchanges rates of CEST agents in vivo are also disclosed.

15 Claims, 5 Drawing Sheets

QUANTITATION OF SAMPLE PROPERTIES USING CONTRAST ENHANCEMENT FROM SATURATION TRANSFER

BACKGROUND

CEST for Chemical Exchange dependent Saturation Transfer (CEST) agents contain a proton with a resonant frequency well enough removed from that of the dominant water line present in most samples that the agent resonance can be saturated by an RF field that has little direct effect on the water. If the resonant proton exchanges chemically with the bulk water, the water magnetization decreases. Under favorable conditions, repeated exchanges can decrease the water magnetization by much more than the total magnetization the agent has at any one time. This multiplier greatly enhances sensitivity.

CEST allows quantitation of a sample property and demonstrated a pH determination. Similar quantitation is very difficult with relaxation-based agents. To see this difficulty, consider an agent whose relaxivity varies in a known way with pH. A measurement of sample signal or even of sample relaxation rate does not give the pH because the relaxation rate depends on concentration as well as pH. In general, contrast agent concentration cannot be predicted in advance, or there would be no point in giving them. Concentration could be determined from relaxation rate for an ordinary relaxation agent with known relaxivity. For the hypothetical pH sensitive contrast agent however, the relaxivity is not known unless the pH is known, in which case there is no need for the agent.

This problem may be solved with a 'dual agent,' one having exchangeable protons with two different resonant frequencies. One type of proton had a pH dependent exchange lifetime; the other type had a pH independent lifetime. Dividing the effect of irradiating one of the resonances by the effect of irradiating the other cancelled the effect of the unknown concentration. For the dual agent method to work as demonstrated by Ward and Balaban, it is necessary that RF irradiation be strong enough to saturate the magnetization of the agent bound protons fully. This much RF may be unsafe for human studies or for large animals.

DETAILED DESCRIPTION

Figure 1:
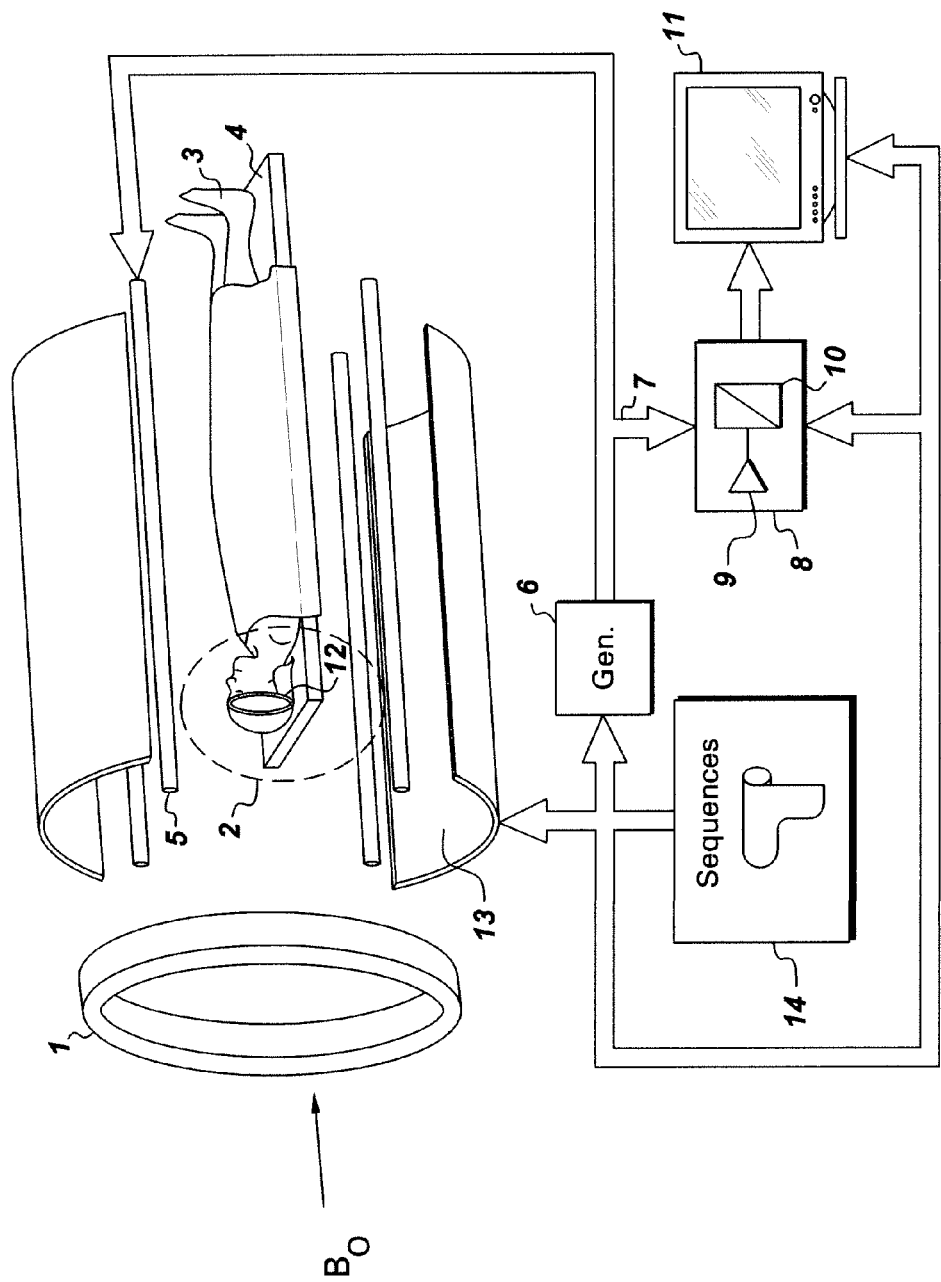
FIG. 1 is a diagram showing components of an MRI system embodiment.

Measuring properties of a sample, such as pH, temperature, or the concentration of any metabolite or solute is a desirable goal. Contrast agents whose relaxivity depends on such a property do not generally allow quantitation of the property, because relaxation rate of the sample, which is measurable, depends not only on the property of interest, but also on the concentration of the contrast agent. The concentration may not be known and is rarely known in vivo. Ward and Balaban lifted the difficulty of the unknown concentration by using a saturation transfer agent with two resonances, one that is affected by the property of interest and the other that is not. See U.S. Patent Publication 2005/0059881. The present invention shows that this difficulty can be lifted even with an agent having only one resonance, or by observing only one resonance of an agent. The present invention determines the rate of chemical exchange by comparing multiple measurements resulting from exposure to different radio frequency pulses, different in strength or in modulation. This rate of exchange can then be related, through a calibration curve, to the tissue property of interest (e.g. pH, temperature, glucose concentration).

Making measurements at multiple RF intensities (at least two), one can extrapolate to the effect that would have been produced by RF strong enough to saturate the agent resonance completely, so that Ward and Balaban's calculation method applies. Additionally, and alternatively, given the measurements at multiple RF strengths used to extrapolate to very strong RF, one can estimate the exchange lifetime of the proton, i.e., exchange rate of contrast agent. This is all that is needed to determine pH (or other properties for agents sensitive to other aspects of the environment, e.g. glucose concentration (3)). With multiple RF strength measurements, dual agents are not needed and RF pulses need not be as strong.

A biological parameter such as, but not limited to, pH, glucose concentration, or other environmental factors such as a metabolite concentration or temperature is measured using a CEST contrast agent having an effect that varies as a function of the environmental factor of interest. Examples of CEST agents that may be used in accord with the teachings herein include, but are not limited to, those discussed in Shanrong Zhang et al., 'A Paramagnetic CEST Agent for Imaging Glucose with MRI,' *JACS communications*, published on web Nov. 3, 2003. U.S. Patent Publication No. 2005/0191243 is cited for providing further information on CEST agents. Those skilled in the art will readily determine available CEST agents suitable for use with certain embodiments. For exemplification purposes only, throughout this application, pH will be used as an example of such biological parameter. It is assumed that a CEST agent is used that is sensitive to pH because the exchange rate of its exchangeable proton depends on pH. Those skilled in the art will appreciate that other properties of the CEST agent, such as but not limited to, chemical shift, may be monitored to determine a biological parameter. This exchange rate is calibrated so that determining the exchange rate determines the pH. See for example, Ward and Balaban, *Magnetic Resonance in Medicine* 44:799-802 (2000). The CEST effect can be measured in MRI images or in NMR spectra. The effect of the agent depends on three unknown properties of the sample, pH, tissue relaxation rate, and agent concentration. Thus, more than one independent measurement must be made to determine the pH. Equipped with the teachings herein, one skilled in the art will appreciate that that there is more than one way to extrapolate this and there are hybrid solutions combining these with each other or with Ward and Balaban's dual agent method. Exemplary methods of extrapolating exchange rate are described in the examples provided infra.

EXAMPLE 1

Extrapolating Exchange Rate by Employing Long CEST Pulses

One measures the CEST effect by making one image (or spectrum) with resonant irradiation of the CEST agent and another with no irradiation or with control irradiation not resonant with the agent or the water. As a simple example, consider measuring signal immediately following a CEST pulse that is long enough to achieve steady state (i.e., magnetization no longer changes). Also, for simplicity, signals may be normalized by employing a measurement with long TR and no CEST irradiation. TR stands for repetition time, as those skilled in the art will appreciate. Note: eq 1 ignores possible magnetization transfer contrast in agent free tissue. At steady state, relaxation increases magnetization at the same rate CEST decreases it, $$0 = (1-m)r - m\, c f(w1,k) \qquad [1]$$

where m is magnetization, r is 1/T1 of tissue in absence of radiation, c is concentration of exchangeable protons on the agent expressed as the size of the agent bound proton pool divided by the water line proton pool (assumed dilute), w1 is the strength of the RF irradiation in angular frequency units, and k is the exchange rate, the reciprocal of the average lifetime of a proton on the agent. The function f describes how readily the agent destroys magnetization when it is irradiated. Rearranging this, $$f(w1,k) = (1/m-1)roc \qquad [2]$$

where roc is r/c. Making measurements at two RF strengths gives the following two equations having two unknowns, k and roc. The magnetizations are measured and the RF strengths are controlled by the operator.

$$f(w1a,k) = (1/ma-1)roc$$

$$f(w1b,k) = (1/mb-1)roc \qquad [3]$$

In an experiment that compares complete saturation with no or control irradiation only, one measures ma and mb, resulting from w1a=0 and w1b=infinity. These give f(w1,k) of 0 and of k respectively.

$$f(w1a,k) = (1/ma-1)roc = 0$$

$$f(w1b,k) = (1/mb-1)roc = k \qquad [4]$$

In this case, these two equations cannot be solved for k. The first equation merely shows that m is 1 with no irradiation. The second single equation contains two unknowns, roc and k.

A different choice of RF strengths and knowledge of the function f allow solution of eq 3 for k and roc, for example as follows. Assume irradiation at the agent resonant frequency and ignore relaxation of protons while bound to the agent. Proton transfer from the water to the agent removes water magnetization at the rate c k m. Proton transfer from agent to water returns part of this magnetization. For protons that were bound for time t, the return rate is c k m cos(w1 t). Averaging over all the possible bound lifetimes weighted with their relative probability, exp(-k t), determines the function f. It integrates to $$f(w1, k) = \frac{k}{1 + \left(\frac{k}{w1}\right)^2} \qquad [5]$$

Substituting this in eq 3 gives $$\frac{k}{1 + \left(\frac{k}{w1a}\right)^2} = \left(\frac{1}{ma} - 1\right)roc \qquad [6]$$

$$\frac{k}{1 + \left(\frac{k}{w1b}\right)^2} = \left(\frac{1}{mb} - 1\right)roc$$

This can be solved for k and roc. The square of k (for compactness) is $$k^2 = \frac{(ma - mb)w1a^2 w1b^2}{-ma\, w1a^2 + mb\, w1b^2 + ma\, mb(w1a^2 - w1b^2)} \qquad [7]$$

Accordingly, eq 7 and other equations described below provide for the extrapolation of k, exchange rate by employing various obtained or known values. The left hand side of eq 7 provides k (squared). The right hand side of the equation comprises all known or measured quantities. ma and mb are measured magnetizations (they are normalized to long TR, no RF, so they are essentially a ratio of two measured magnetizations). w1a and w1b are machine settings.

A more complicated function than f defined by eq 5 could likewise be substituted into eq 1 and those relying on it and solved for k. Examples of more advanced functions are those that consider relaxation of protons while bound to the agent, off resonance irradiation, or that allow for the fact that the water magnetization does not point exactly along the z axis during CEST irradiation but along the effective field water magnetization sees in the rotating frame.

EXAMPLE 2

Extrapolating Exchange via Modulated RF Pulse

The previous embodiment compared results of long, unmodulated, resonant pulses to each other and to no pulse or to an off resonant, control pulse. Modulating the pulses can modify the CEST effect in a predictable and potentially useful manner. For example (FIG. 1), generating 180 degree pulses considerably shorter than the chemical exchange lifetime of protons bound to the agent, and separating these by delays long compared to this lifetime makes the CEST effect relatively independent of k, provided k remains within the limits set by the pulse duration δ and interpulse delay duration Δ (as long as δ<<1/k and Δ>>1/k, k will have little influence on the CEST effect but CEST effect will be proportional to agent concentration). If tissue relaxation rate is known or measured, this 'k independent' CEST experiment would show the agent concentration. Knowing the concentration and the relaxation rate, the standard, unmodulated CEST experiment result allows equation 1 to be solved for k. Hence, this is another embodiment for the determination of exchange rate.

In the context of eq 1, modulated pulses can simply be regarded as giving a different function f. In general, the function f will need more description of the RF than just w1. The function could depend differently on k than does the example in eq 5. Less strongly as explained in the paragraph above or more strongly dependent as, for example by switching the pulse phase 180 degrees at intervals near the agent-bound proton exchange lifetime.

In a specific embodiment of determining exchange rate of a contrast agent, a first step comprises measuring magnetization without CEST pulses (it is noted that use of the terms first, second, etc., unless otherwise specifically stated for this or any other embodiment, does not necessarily denote that the steps must be followed in a particular order; those skilled in the art will recognize that steps may be carried out in alternate sequences to obtain the same information). Measuring magnetization can be achieved, for example, by making an image of many voxels in the sample, or according to other methods known in the art. Those skilled in the art will appreciate that measuring magnetization utilizes an observation pulse(s). The magnetization may be provided in arbitrary units. The second step is to measure the magnetization with a train of CEST pulses that extends over several T1: steady state is reached and the pulse durations are very small compared to the average lifetime of a proton on the agent while the pulse separations are very long compared to this life time. Third, the image intensities of each pixel with the CEST pulses on may be divided by the intensities with the CEST pulses off (or applied at a off resonant control frequency). This normalized magnetization is dimensionless and should lie in the range 0 to 1. Normalized magnetization is henceforth referred to as m.

At steady state, the following equation applies $$0 = (1-m)r - c\,m(1-\cos(\text{flip}))/\text{DELTA} \quad [8]$$

where flip is the flip angle of each of the CEST pulses in the train and DELTA the time from start of one CEST pulse to start of the next. The first term on the right is the rate at which m relaxes toward its equilibrium value 1. The second term on the right is the rate at which m is lost (toward 0) by exchange with the CEST agent. This loss rate is proportional to the amount of the CEST agent present and to m itself. (If m is 0, none can be lost by exchange with the agent.) Protons moving from the bulk pool to the agent carry magnetization with them. Protons going from agent to bulk pool carry some back, hence the 1−cos(flip) in the equation. If the flip is 90 degrees, all the magnetization on the agent is destroyed by the pulse and this is exchanged before the next pulse, so this factor is just 1. If the flip is 180 degrees, the agent is twice as effective, reversing the direction of the agent bound proton magnetization before sending it back to the bulk water pool, thereby doubling 1−cos(flip).

Manipulating equation 8 gives equation 9

$$roc = r/c = m(1-\cos(\text{flip}))/(1-m) \quad [9]$$

For convenience, roc represents the quotient of two variables, r and c, a single variable.

In a fourth step, roc can be determined using m, as measured by the steps above, and flip is known since it is controlled by the operator. At this point, knowing roc, one can employ the measurement that is obtained with a long, continuous RF CEST pulse, (see Example 1). Substituting eq 5 into eq 2, gives $$0 = (1-m)r - mc\frac{k}{1+\left(\frac{k}{wl}\right)^2}$$

(The m used here is again a normalized value. The same image can be used to normalize this value as was used to normalized m with the train of short pulses, if no CEST irradiation was used for normalization. If a train of off resonant dummy CEST pulses was used to normalize the pulse train result, it is better practice to make another image using a long, off resonant CEST dummy pulse to normalize the long CEST pulse result. Thus two normalized magnetization values for a voxel come from 3 or 4 images.) Dividing through by c gives $$0 = (1-m)roc - m\frac{k}{1+\left(\frac{k}{wl}\right)^2}$$

It is again noted that, as in any of these embodiments, eq 5 is not the only possible function for describing the effect of the agent when the RF is on. Those skilled in the art will appreciate that other functions may be defined. For a case where a different function could be useful, consider imaging a subject with two targeted CEST agents having resonances at frequencies A and B that overlap somewhat. Irradiating A somewhat off resonance could avoid undesired effects from the B resonance. The A resonance will have less effect as RF is moved slightly off resonance, but equation 5 does not take this in to account. A more elaborate function would be desired.

If roc is not known, there are an infinite number of possible k that fit the condition above. Knowing roc the quadratic equation above can be solved to give 2 possible solutions for k $$-\frac{m\,wl^2 + \sqrt{wl^2(-4(-1+m)^2 roc^2 + m^2 wl^2)}}{2(-1+m)roc}\text{ and}$$

$$\frac{-m\,wl^2 + \sqrt{wl^2(-4(-1+m)^2 roc^2 + m^2 wl^2)}}{2(-1+m)roc}$$

Prior knowledge may dictate the choice. For example, if the determination is part of a series, and the first solutions indicate pH increasing as time passes, the second solutions will indicate pH is decreasing. One of these choices may be unreasonable leaving the other as correct. More simply, one solution may lie within the expected range, the other not.

EXAMPLE 3

Extrapolating Exchange Rate Via Multiple, Short-pulses

It is not necessary that TR or CEST pulse duration be long compared to T1. Other pulse sequences may be used with CEST. For example, perhaps as a time saving, CEST irradiation pulses can be added preceding each observation pulse in a short TR, low flip angle, gradient echo sequence. The repeated observation pulses add another term to eq 1 and, because the CEST irradiation is not left on during the observation steps, the CEST effect must be scaled down by the duty cycle of the CEST irradiation. With the function defined in eq 5, eq 1 becomes $$0 = (1-m)r - mc\,duty\frac{k}{1+\left(\frac{k}{wl}\right)^2} - m\frac{1-\cos(\text{flip})}{TR} \quad [10]$$

$$= (1-m)r - mc\,duty\frac{k}{1+\left(\frac{k}{wl}\right)^2} - mrtrf$$

Each observation pulse reduces longitudinal magnetization by the fraction 1−cos(flip) of what it was, where flip refers to the observation pulse. Dividing this by TR gives a rate, a justifiable way to handle this, provided that flip is small and TR<<T1. Above, this rate is called rtrf.

Solving two simultaneous equations based on eq 10 with two different RF strengths gives $$k^2 = \frac{(ma-mb)rwla^2wlb^2}{r(-ma\,wla^2 + mb\,wlb^2) + ma\,mb(r+rtrf)(wla^2 - wlb^2)} \quad [11]$$

If flip is small enough and TR short enough, so eq 10 is valid, and if rtrf<<r, rtrf can be ignored and the answer is the same as in the long pulse embodiment; the tissue relaxation rate cancels and need not be known. If the rtrf is not small compared to relaxation, the relaxation must be known to find k and pH. This third embodiment provides several advantageous aspects. Besides allowing faster imaging, it provides an example of one way to allow imaging more than one slice at a time. Those skilled in the art will appreciate that there are other methodologies for imaging more than one slice at a time.

In a specific embodiment, signals using two different RF strengths, w1a and w1b, each on the agent resonant frequency are measured. It is important that at least one of the RF strengths is below the amount sufficient to cause saturation of the agent. Controls are obtained by measuring signals using RF strengths w1a and w1b but off the agent resonance frequency. The signals obtained on resonance are divided by the off resonance results to obtain normalized ma and mb. A value of r is determined. This can be obtained by any means known in the art or, at some risk of accuracy, literature values may be assumed. rtrf as defined by eq 10 is determined. This requires the flip of the observation pulse and TR of the pulse sequence. A calibration experiment could be designed to measure this factor. By employing the obtained values of ma, mb, w1a, w1b, r, and rtrf into equation 11, one can then obtain k. As discussed above, once k is determined a biological parameter such as pH is determined by basic calibration methods.

Exchange rate is determinable by another specific embodiment. Of the 3 terms on the right hand side of eq 9, two are proportional to r, and the other to r+rtrf. When it can be seen that r>>rtrf, the terms can all be divided by r. This leaves two terms that have no r and another with a factor 1+rtrf/r, which is very close to 1. In this case it is likely not necessary to measure r, because r will then have little influence on the result, a rough estimate will suffice. If rtrf/r is assumed to be 0, equation 11 reduces to eq 7 similar to the result for the long pulse method embodiment described in Example 1.

It should be noted that in accordance with conventional patent claim construction, use herein of the terms first, second, third, etc., unless stated otherwise, does not refer to an order or temporal sequence, but is used simply delineate a given limitation from another limitation.

EXAMPLE 4

MRI system, and Computer Program Products for Use with Same, for Determining Biological Parameter As will be appreciated by one of skill in the art, embodiments of the present invention may be embodied as a device or system comprising a processing module, and/or computer program product comprising at least one program code module. Accordingly, the present invention may take the form of an entirely hardware embodiment or an embodiment combining software and hardware aspects. Furthermore, the present invention may include a computer program product on a computer-usable storage medium having computer-usable program code means embodied in the medium. Any suitable computer readable medium may be utilized including hard disks, CD-ROMs, DVDs, optical storage devices, or magnetic storage devices.

The term "processing module" may include a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The processing module may have operationally coupled thereto, or integrated therewith, a memory device. The memory device may be a single memory device or a plurality of memory devices. Such a memory device may be a read-only memory, random access memory, volatile memory, non-volatile memory, static memory, dynamic memory, flash memory, and/or any device that stores digital information. A computer, as used herein, is a device that comprises at least one processing module.

The computer-usable or computer-readable medium may be or include, for example, but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM), a CD ROM, a DVD (digital video disk), or other electronic storage medium. Note that the computer-usable or computer-readable medium could even be paper or another suitable medium upon which the program is printed, as the program can be electronically captured, via, for instance, optical scanning of the paper or other medium, then compiled, interpreted or otherwise processed in a suitable manner if necessary, and then stored in a computer memory.

Computer program code for carrying out operations of certain embodiments of the present invention may be written in an object oriented and/or conventional procedural programming languages including, but not limited to, Java, Smalltalk, Perl, Python, Ruby, Lisp, PHP, "C", FORTRAN, or C++. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Certain embodiments of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer-readable program code modules. These program code modules may be provided to a processing module of a general purpose computer, special purpose computer, embedded processor or other programmable data processing apparatus to produce a machine, such that the program code modules, which execute via the processing module of the computer or other programmable data processing apparatus, create means for implementing the functions specified in the flowchart and/or block diagram block or blocks.

These computer program code modules may also be stored in a computer-readable memory that can direct a computer or other programmable data processing apparatus to function in a particular manner, such that the program code modules stored in the computer-readable memory produce an article of manufacture.

The computer program code modules may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart and/or block diagram block or blocks.

FIG. 1 shows an NMR apparatus embodiment of the subject invention. Briefly, the apparatus comprises means 1 for producing an intense, continuous and homogeneous magnetic field $B_o$ in a region of examination 2. A body 3, supported for example by a table 4, is brought close to the region 2. Throughout the experiment, the body remains subjected to the magnetic field $B_o$. With an antenna 5 connected to a generator 6, it is possible to bring about the excitation of the magnetic moments of the particles of the body 3 located in the region of examination 2. The antenna 5 and generator 6 are configured to generate and deliver irradiation to excite water protons on water molecules (or some other endogenous molecule) and protons on CEST agents administered to a subject. Those skilled in the art will appreciate in view of the teachings herein that inducing irradiation and receiving signals, whether they be protons on water, or some other endogenous molecule, or protons on the CEST agent, may be carried out by separate generator and antenna components. In one example, the antenna 5 is a bar antenna capable of producing a rotating excitation field, by the phase-shifted excitation of each of the bars.

The excitations are temporary. At the end of these excitations, the antenna 5 may serve to pick up the de-excitation signal to conduct it, through a duplexer 7, to a receiver 8. The receiver 8 conventionally comprises amplification and demodulation circuits 9 and at least one processing module 10. The processing may include the shaping of the signal in order to represent it on a display 11. The image of a slice 12 of the body 3 can then be made to appear on the screen of the display 11. An imaging sequence designed to obtain an image may comprise a plurality of excitation-measurement sequences during each of which gradient coils 13 are used to apply encodings to the free precession signal of the magnetic moments. These encodings, as well as the working of the generator 6, the duplexer 7 and the receiver 8 and display 11 are governed by a controller 14 whose actions are organized by a program code modules. All these elements are known per se. In particular, the controller 14 possesses the property of programmability of its sequences.

Figure 2:
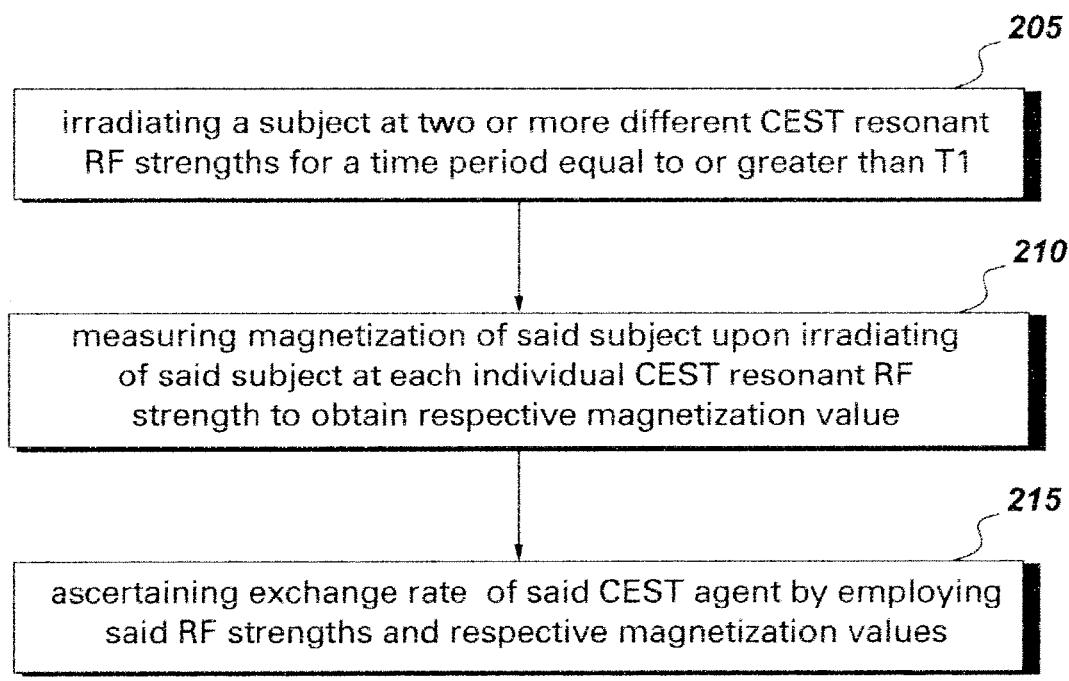
FIG. 2 is a flow diagram depicting steps for determining exchange rate of a CEST agent in vivo.

It is thus possible, in the program, to achieve the simple modification of the operations to be performed in order to change the nature of the sequences undertaken. FIG. 2 shows a flow diagram of sequences that may be executed by the controller as dictated by computer program code modules; irradiating said subject at two or more different CEST resonant RF strengths for a time period equal to or greater than T1 205; measuring magnetization of said subject upon irradiating of said subject at each individual resonant RF strengths to obtain respective magnetization values 210; and ascertaining exchange rate of said CEST agent by employing said RF strengths and respective magnetization values 215.

Figure 3:
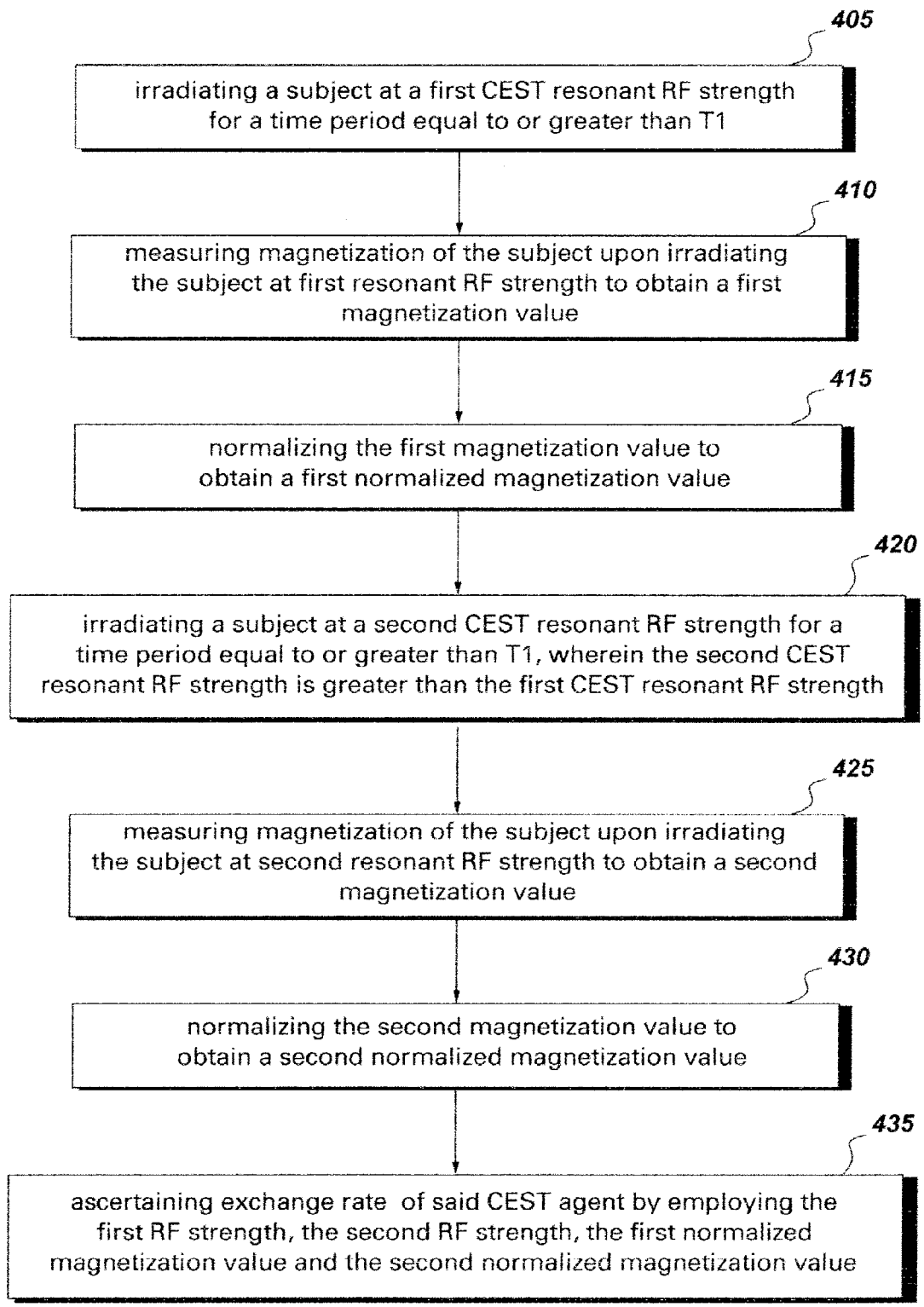
FIG. 3 is a flow diagram depicting steps for determining exchange rate of a CEST agent in vivo.

FIG. 3 shows a flow diagram of sequences that may be executed by the controller as dictated by computer program code modules: irradiating of said subject at a first CEST resonant RF strength for a time period equal to or greater than T1 405; measuring magnetization of said subject upon irradiating said subject at a first resonant RF strength to obtain a first magnetization value 410; normalizing said first magnetization value to obtain a first normalized magnetization value 415; irradiating said subject at a second CEST resonant RF strength for a time period equal to or greater than T1, wherein said second CEST resonant RF strength is greater than said first CEST resonant RF strength 420; measuring magnetization of said subject upon irradiating said subject at a second CEST resonant RF strength to obtain second magnetization value 425; normalizing said second magnetization value to obtain a second normalized magnetization value 430; and ascertaining exchange rate of said CEST agent by employing said first CEST resonant RF strength, said second CEST resonant RF strength, said first normalized magnetization value and said second normalized magnetization value 435.

Figure 4:
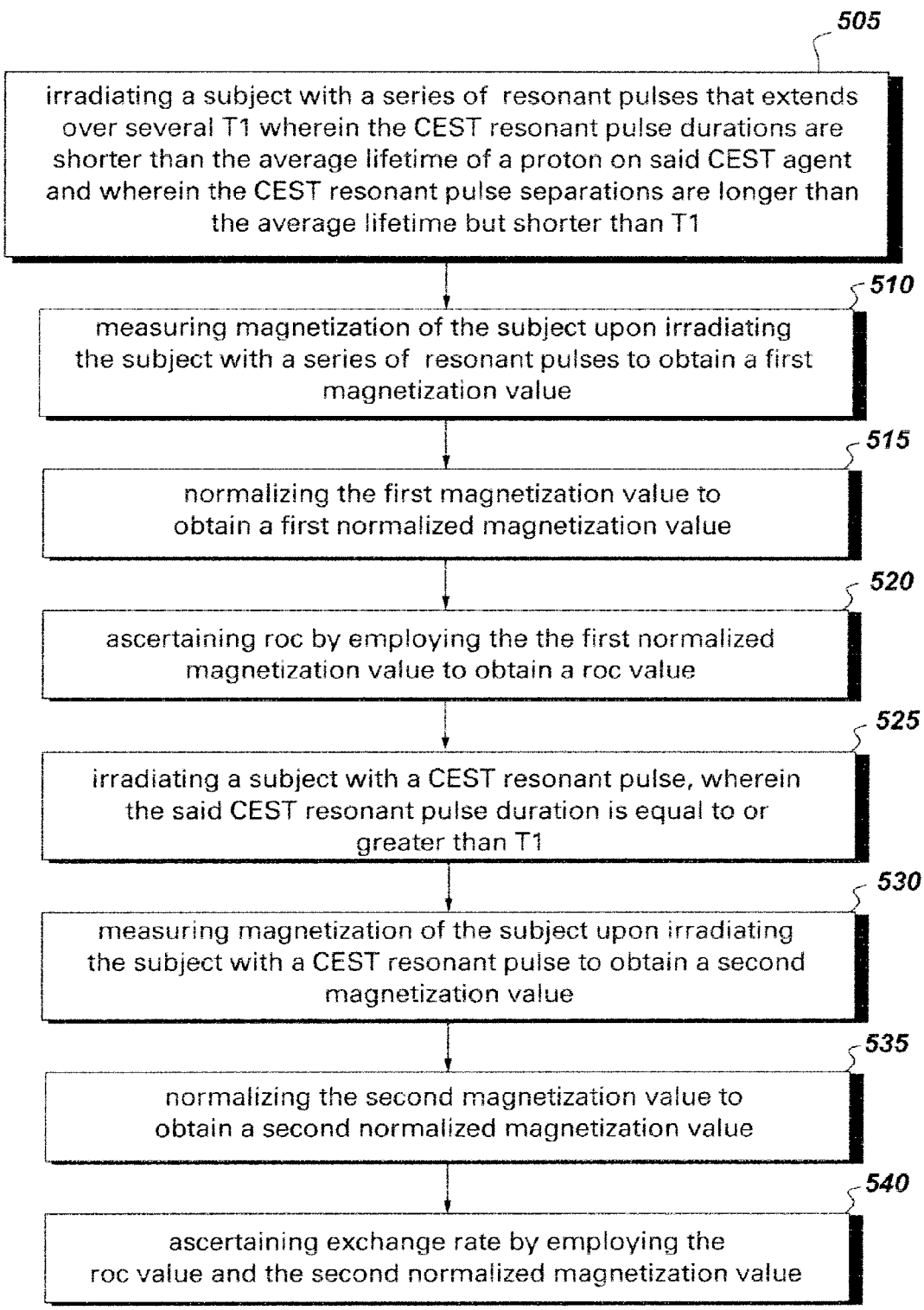
FIG. 4 is a flow diagram depicting steps for determining exchange rate of a CEST agent in vivo.

FIG. 4 shows a flow diagram of sequences that may be executed by the controller as dictated by computer program code modules: irradiating said subject with a series of CEST resonant pulses that extends over several T1 wherein CEST resonant pulse durations are shorter than an average lifetime of a proton on said CEST agent and wherein CEST resonant pulse separations are longer than said average lifetime but shorter than T1 505; measuring magnetization of said subject upon said irradiating said subject with a series of CEST resonant pulses to obtain a first magnetization value 510; normalizing said first magnetization value to obtain a first normalized magnetization value 515; ascertaining roc by employing said first magnetization value to obtain a roc value 520; irradiating said subject with a CEST resonant pulse, wherein said CEST pulse duration is equal to or greater than T1 525; measuring magnetization of said subject upon irradiating said subject with a CEST resonant pulse to obtain a second magnetization value 530; normalizing said second magnetization value to obtain a second normalized magnetization value 535; and ascertaining exchange rate by employing said roc value and said second normalized magnetization value 540.

Figure 5:
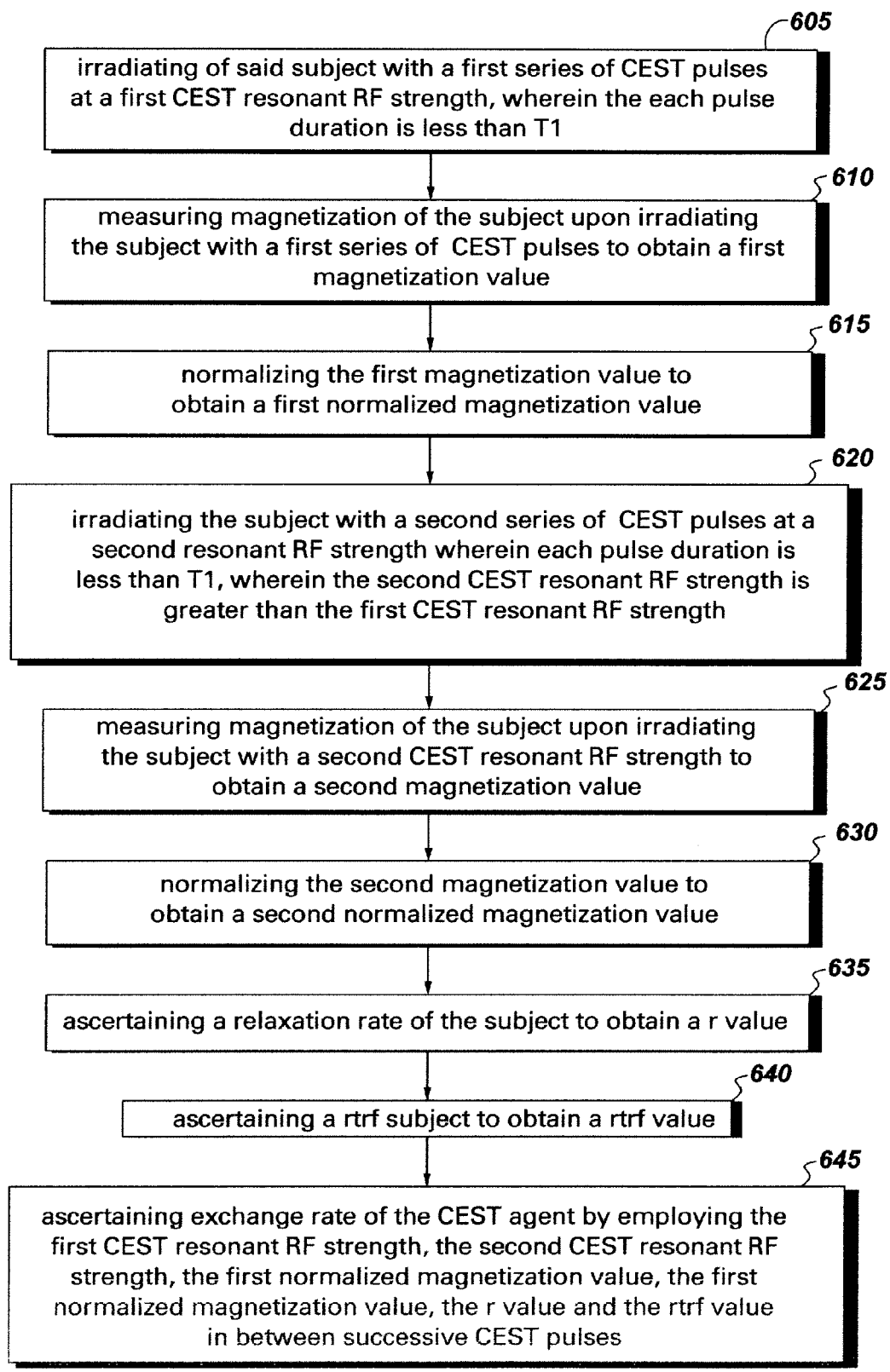
FIG. 5 is a flow diagram depicting steps for determining exchange rate of a CEST agent.

FIG. 5 shows an example of another flow diagram of sequences that may be executed by the controller as dictated by computer program code modules: irradiating of said subject with a first series of CEST pulses at a first CEST resonant RF strength, wherein each pulse duration is less than T1 605; measuring magnetization of said subject upon irradiating said subject with a first series of CEST pulses to obtain a first magnetization value 610; normalizing said first magnetization value to obtain a first normalized magnetization value 615; irradiating said subject with a second series of CEST pulses at a second CEST resonant RF strength wherein each pulse duration is less than T1, wherein said second CEST resonant RF strength is greater than said first CEST resonant RF strength 620; measuring magnetization of said subject upon irradiating said subject at a second CEST resonant RF strength to obtain second magnetization value 625; normalizing said second magnetization value to obtain a second normalized magnetization value 630; ascertaining a relaxation rate of said subject to obtain an r value 635; ascertaining rtrf to obtain an rtrf value 640; and ascertaining exchange rate of said CEST agent by employing said first CEST resonant RF strength, said second CEST resonant RF strength, said first normalized magnetization value; said second normalized magnetization value, said r value and said rtrf value 645.

FIG. 5 shows a flow diagram of sequences that may be executed by the controller as dictated by computer program code modules: irradiating said subject with a series of CEST resonant pulses that extends over several T1 wherein CEST resonant pulse durations are shorter than an average lifetime of a proton on said CEST agent and wherein CEST resonant pulse separations are longer than said average lifetime but shorter than T1 505; measuring magnetization of said subject upon said irradiating said subject with a series of CEST resonant pulses to obtain a first magnetization value 510; normalizing said first magnetization value to obtain a first normalized magnetization value 515; ascertaining roc by employing said first magnetization value to obtain a roc value 520; irradiating said subject with a CEST resonant pulse, wherein said CEST pulse duration is equal to or greater than T1 525; measuring magnetization of said subject upon irradiating said subject with a CEST resonant pulse to obtain a second magnetization value 530; normalizing said second magnetization value to obtain a second normalized magnetization value 535; and ascertaining exchange rate by employing said roc value and said second normalized magnetization value 540.

FIG. 6 shows an example of another flow diagram of sequences that may be executed by the controller as dictated by computer program code modules: irradiating of said subject with a first series of CEST pulses at a first CEST resonant RF strength, wherein each pulse duration is less than T1 605; measuring magnetization of said subject upon irradiating said subject with a first series of CEST pulses to obtain a first magnetization value 610; normalizing said first magnetization value to obtain a first normalized magnetization value 615; irradiating said subject with a second series of CEST pulses at a second CEST resonant RF strength wherein each pulse duration is less than T1, wherein said second CEST resonant RF strength is greater than said first CEST resonant RF strength 620; measuring magnetization of said subject upon irradiating said subject at a second CEST resonant RF strength to obtain second magnetization value 625; normalizing said second magnetization value to obtain a second normalized magnetization value 630; ascertaining a relaxation rate of said subject to obtain an r value 635; ascertaining rtrf to obtain an rtrf value 640; and ascertaining exchange rate of said CEST agent by employing said first CEST resonant RF strength, said second CEST resonant RF strength, said first normalized magnetization value; said second normalized magnetization value, said r value and said rtrf value 645.

All patents, patent applications, publications, texts and references discussed or cited herein are incorporated by reference to the extent not inconsistent with the teachings herein. In addition, all terms not specifically defined are first taken to have the meaning given through usage in this disclosure, and if no such meaning is inferable, their normal meaning. Where a limitation is described but not given a specific term, a term corresponding to such limitation may be taken from any references, patents, applications, and other documents cited herein.

The present invention is not to be limited in scope by the specific embodiments described herein. Indeed, various modifications of the invention in addition to those described herein will become apparent to those skilled in the art from the foregoing description. Such modifications are intended to fall within the scope of the appended claims. Thus, for the above variations and in other regards, it should be understood that the examples and embodiments described herein are for illustrative purposes only and that various modifications or changes in light thereof will be suggested to persons skilled in the art and are to be included within the spirit and purview of this application and the scope of the appended claims.

What is claimed is:

1. A method of determining a physical or chemical parameter in physiological tissues, in vivo, by employing MRI or NMR spectroscopy, said method comprising:
administering a CEST contrast agent to a subject;
determining an exchange rate of the CEST agent at a specified location in vivo; and
comparing said exchange rate to a standard curve to determine a physical or chemical parameter at said specified location, wherein determining the exchange rate of the CEST agent at a specified location in vivo comprises:
irradiating of said subject, while in a magnetic field, at a first CEST resonant RF strength for a time period equal to or greater than T1;
measuring magnetization of said subject upon irradiating said subject at a first CEST resonant RF strength to obtain a first magnetization value;
irradiating said subject, while in the magnetic field, at a second CEST resonant RF strength for a time period equal to or greater than T1, wherein said second CEST resonant RF strength is greater than said first CEST resonant RF strength;
measuring magnetization of said subject upon irradiating said subject at a second CEST resonant RF strength to obtain second magnetization value; and
ascertaining exchange rate of said CEST agent by employing said first CEST resonant RF strength, said second CEST resonant RF strength, said first magnetization value and said second magnetization value.

2. The method of claim 1, further comprising the steps of normalizing said first magnetization value to obtain a first normalized magnetization value; and normalizing said second magnetization value to obtain a second normalized magnetization value; wherein ascertaining exchange rate employs said first and second normalized magnetization values in place of said first and second magnetization values.

3. The method of claim 2, wherein said determining is conducted by employing two or more magnetization measurements obtained upon irradiating said subject with irradiation resonant of said CEST contrast agent, said irradiating conducted at two or more RF intensities or RF modulation, or both.

4. A method of determining a physical or chemical parameter in physiological tissues, in vivo, by employing MRI or NMR spectroscopy, said method comprising:
administering a CEST contrast agent to a subject;
determining an exchange rate of the CEST agent at a specified location in vivo; and
comparing said exchange rate to a standard curve to determine a physical or chemical parameter at said specified location, wherein determining the exchange rate of the CEST agent comprises:
subjecting said subject to a static magnetic field;
irradiating said subject at two or more different CEST resonant RF strengths for a time period equal to or greater than T1;
measuring magnetization of said subject upon irradiating of said subject at each individual resonant RF strengths to obtain respective magnetization values; and ascertaining exchange rate of said CEST agent by employing said RF strengths and respective magnetization values.

5. A method of determining a physical or chemical parameter in physiological tissues, in vivo, by employing MRI or NMR spectroscopy, said method comprising:
   administering a CEST contrast agent to a subject;
   determining an exchange rate of the CEST agent at a specified location in vivo; and
   comparing said exchange rate to a standard curve to determine a physical or chemical parameter at said specified location, wherein determining the exchange rate of the CEST agent comprises:
   irradiating said subject, while in a magnetic field, with a series of CEST resonant pulses that extends over several T1 wherein CEST resonant pulse durations are shorter than an average lifetime of a proton on said CEST agent and wherein CEST resonant pulse separations are longer than said average lifetime but shorter than T1;
   measuring magnetization of said subject upon said irradiating said subject with a series of CEST resonant pulses to obtain a first magnetization value;
   ascertaining roc, whereby roc is equal to nc and where r is 1/T1 and c is concentration of exchangeable protons on the agent, by employing said first magnetization value to obtain a roc value;
   irradiating said subject, while in the magnetic field, with a CEST resonant pulse, wherein said CEST pulse duration is equal to or greater than T1;
   measuring magnetization of said subject upon irradiating said subject with a CEST resonant pulse to obtain a second magnetization value; and
   ascertaining exchange rate by employing said roc value and said second magnetization value.

6. The method of claim 5, further comprising the steps of normalizing said first magnetization value to obtain a first normalized magnetization value; normalizing said second magnetization value to obtain a second normalized magnetization value; wherein ascertaining exchange rate employs said first and second normalized magnetization values in place of said first and second magnetization values.

7. A method of determining a physical or chemical parameter in physiological tissues, in vivo, by employing MRI or NMR spectroscopy, said method comprising:
   administering a CEST contrast agent to a subject;
   determining an exchange rate of the CEST agent at a specified location in vivo; and
   comparing said exchange rate to a standard curve to determine a physical or chemical parameter at said specified location, wherein determining the exchange rate of the CEST agent comprises:
   irradiating of said subject, while in a magnetic field, with a first series of CEST pulses at a first CEST resonant RF strength, wherein each pulse duration is less than T1;
   measuring magnetization of said subject upon irradiating said subject with a first series of CEST pulses to obtain a first magnetization value;
   irradiating said subject with a second series of CEST pulses at a second CEST resonant RF strength wherein each pulse duration is less than T1, wherein said second CEST resonant RF strength is greater than said first CEST resonant RF strength;
   measuring magnetization of said subject upon irradiating said subject at a second CEST resonant RF strength to obtain second magnetization value;
   ascertaining rtrf, wherein rtrf is a rate defined by [1−cos (flip)]/TR and where TR is repetition time, to obtain an rtrf value; and
   ascertaining exchange rate of said CEST agent by employing said first CEST resonant RF strength, said second CEST resonant RF strength, said first magnetization value; said second magnetization value, and said rtrf value.

8. The method of claim 7, further comprising ascertaining a relaxation rate of said subject to obtain an r value; wherein ascertaining exchange rate employs said r value.

9. The method of claim 7, further comprising normalizing said first magnetization value to obtain a first normalized magnetization value; normalizing said second magnetization value to obtain a second normalized magnetization value; wherein ascertaining exchange rate employs said first and second normalized magnetization values in place of said first and second magnetization values.

10. The method of claim 7, further comprising subjecting said subject to observation pulses in between successive CEST pulses such that imaging of said subject is more rapidly achieved.

11. The method of claim 7, further comprising subjecting said subject to observation pulse in between successive CEST pulses such that imaging two or more slices of said subject may be achieved concurrently.

12. A magnetic resonance imaging apparatus comprising
   a magnet for generating a static magnetic field in a space where a subject to be examined is placed,
   an RF pulse generator for repeatedly applying an RF pulse to produce NMR in the subject,
   a generator for applying gradient magnetic fields in a slice direction, in a phase encode direction or in a readout direction, or a combination thereof,
   a receiver for detecting signals emitted from the subject,
   an imager for producing at least one image of the subject from the signals detected by the receiver,
   a controller for controlling said magnet, RF pulse generator, gradient field generator and receiver, said controller comprising at least one processing module and a computer-usable medium comprising computer readable program code modules, wherein said computer readable program code modules are configured to cause said controller to generate CEST resonant RF pulses and to process signals from said subject in order to determine an exchange rate of a predetermined CEST agent administered to said subject, wherein said computer program code modules comprise:
   a computer readable first program code module for causing said controller to irradiate said subject at two or more different CEST resonant RF strengths for a time period equal to or greater than T1;
   a computer readable second program code module for causing said controller to measure magnetization of said subject upon irradiating of said subject at each individual resonant RF strengths to obtain respective magnetization values; and
   a computer readable third program code module for causing said controller to calculate exchange rate of said CEST agent by employing said RF strengths and respective magnetization values.

13. A magnetic resonance imaging apparatus comprising
   a magnet for generating a static magnetic field in a space where a subject to be examined is placed,
   an RF pulse generator for repeatedly applying an RF pulse to produce NMR in the subject,
   a generator for applying gradient magnetic fields in a slice direction, in a phase encode direction or in a readout direction, or a combination thereof,
   a receiver for detecting signals emitted from the subject,
   an imager for producing at least one image of the subject from the signals detected by the receiver, a controller for controlling said magnet, RF pulse generator, gradient field generator and receiver, said controller comprising at least one processing module and a computer-usable medium comprising computer readable program code modules, wherein said computer readable program code modules are configured to cause said controller to generate CEST resonant RF pulses and to process signals from said subject in order to determine an exchange rate of a predetermined CEST agent administered to said subject, wherein said computer program code modules comprise:

a computer readable first program code module for causing said controller to irradiate said subject at a first CEST resonant RF strength for a time period equal to or greater than T1;

a computer readable second program code module for causing said controller to measure magnetization of said subject upon irradiating of said subject at a first resonant RF strength to obtain a first magnetization value;

a computer readable third program code module for causing said controller to irradiate said subject at a second CEST resonant RF strength for a time period equal to or greater than T1, wherein said second CEST resonant RF strength is greater than said first CEST resonant RF strength;

a computer readable fourth program code module for causing said controller to measure magnetization of said subject upon irradiating of said subject at a second CEST resonant RF strength to obtain second magnetization value; and a computer readable fifth program code module for causing said controller to calculate exchange rate of said CEST agent by employing said first CEST resonant RF strength, said second CEST resonant RF strength, said first magnetization value and said second magnetization value.

14. A magnetic resonance imaging apparatus comprising a magnet for generating a static magnetic field in a space where a subject to be examined is placed, an RF pulse generator for repeatedly applying an RF pulse to produce NMR in the subject, a generator for applying gradient magnetic fields in a slice direction, in a phase encode direction or in a readout direction, or a combination thereof, a receiver for detecting signals emitted from the subject, an imager for producing at least one image of the subject from the signals detected by the receiver, a controller for controlling said magnet, RF pulse generator, gradient field generator and receiver, said controller comprising at least one processing module and a computer-usable medium comprising computer readable program code modules, wherein said computer readable program code modules are configured to cause said controller to generate CEST resonant RF pulses and to process signals from said subject in order to determine an exchange rate of a predetermined CEST agent administered to said subject, wherein said program code modules comprise:

a computer readable first program code module for causing said controller to irradiate said subject with a series of CEST resonant pulses that extends over several T1 wherein CEST resonant pulse durations are shorter than an average lifetime of a proton on said CEST agent and wherein CEST resonant pulse separations are longer than said average lifetime but shorter than T1;

a computer readable second program code module for causing said controller to measure magnetization of said subject upon irradiating of said subject with a series of CEST resonant pulses to obtain a first magnetization value;

a computer readable third program code module for causing said controller to calculate roc by employing said first magnetization value to obtain a roc value;

a computer readable fourth program code module for causing said controller to irradiate said subject with a CEST resonant pulse, wherein said CEST pulse duration is equal to or greater than T1;

a computer readable fifth program code module for causing said controller to measure magnetization of said subject upon irradiating of said subject with a CEST resonant pulse to obtain a second magnetization value; and a computer readable sixth program code module for causing said controller to calculate exchange rate by employing said roc value and said second magnetization value.

15. A magnetic resonance imaging apparatus comprising a magnet for generating a static magnetic field in a space where a subject to be examined is placed, an RF pulse generator for repeatedly applying an RF pulse to produce NMR in the subject, a generator for applying gradient magnetic fields in a slice direction, in a phase encode direction or in a readout direction, or a combination thereof, receiver for detecting signals emitted from the subject, an imager for producing at least one image of the subject from the signals detected by the receiver, controller for controlling said magnet, RF pulse generator, gradient field generator and receiver, said controller comprising at least one processing module and a computer-usable medium comprising computer readable program code modules, wherein said computer readable program code modules are configured to cause said controller to generate CEST resonant RF pulses and to process signals from said subject in order to determine an exchange rate of a predetermined CEST agent administered to said subject, wherein said program code modules comprise:

a computer readable first program code module for causing said controller to irradiate said subject with a first series of CEST pulses at a first CEST resonant RF strength, wherein each pulse duration is less than T1;

a computer readable second program code module for causing said controller to measure magnetization of said subject upon irradiating said subject with a first series of CEST pulses to obtain a first magnetization value;

a computer readable third program code module for causing said controller to irradiate said subject with a second series of CEST pulses at a second CEST resonant RF strength wherein each pulse duration is less than T1, wherein said second CEST resonant RF strength is greater than said first CEST resonant RF strength;

a computer readable fourth program code module for causing said controller to measure magnetization of said subject upon irradiating said subject at a second CEST resonant RF strength to obtain second magnetization value;

a computer readable fifth program code module for causing said controller to calculate a relaxation rate of said subject to obtain an r value;

a computer readable sixth program code module for causing said controller to calculate rtrf to obtain an rtrf value; and a computer readable seventh program code module for causing said controller to calculate exchange rate of said CEST agent by employing said first CEST resonant RF strength, said second CEST resonant RF strength, said first magnetization value; said second magnetization value, said r value and said rtrf value.

* * * * *

UNITED STATES PATENT AND TRADEMARK OFFICE
CERTIFICATE OF CORRECTION

PATENT NO. : 7,610,077 B2  Page 1 of 1
APPLICATION NO. : 11/297263
DATED : October 27, 2009
INVENTOR(S) : Dixon et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 972 days.

Signed and Sealed this

Twelfth Day of October, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,610,077 B2 | Page 1 of 3 |
| APPLICATION NO. | : 11/297263 | |
| DATED | : October 27, 2009 | |
| INVENTOR(S) | : Dixon et al. | |

It is certified that error appears in the above-identified patent and that said Letters Patent is hereby corrected as shown below:

In Column 3, Equation 5, Lines 56-59, delete " $f(wl,k) = \dfrac{k}{1+\left(\dfrac{k}{wl}\right)^2}$ " and insert -- $f(wl,k) = \dfrac{k}{1+\left(\dfrac{k}{wl}\right)^2}$ --, therefor.

In Column 3, Equation 6, Lines 65-66, delete " $\dfrac{k}{1+\left(\dfrac{k}{wla}\right)^2}$ " and insert -- $\dfrac{k}{1+\left(\dfrac{k}{wla}\right)^2}$ --, therefor.

In Column 4, Lines 2-4, delete " $\dfrac{k}{1+\left(\dfrac{k}{wlb}\right)^2}$ " and insert -- $\dfrac{k}{1+\left(\dfrac{k}{wlb}\right)^2}$ --, therefor.

In Column 4, Equation 7, Lines 10-13, delete " $k^2 = \dfrac{(ma-mb)wla^2 wlb^2}{-ma\, wla^2 + mb\, wlb^2 + ma\, mb(wla^2 - wlb^2)}$ " and insert -- $k^2 = \dfrac{(ma-mb)wla^2 wlb^2}{-ma\, wla^2 + mb\, wlb^2 + ma\, mb(wla^2 - wlb^2)}$ --, therefor.

Signed and Sealed this
Seventeenth Day of July, 2012

David J. Kappos
*Director of the United States Patent and Trademark Office*

CERTIFICATE OF CORRECTION (continued)
U.S. Pat. No. 7,610,077 B2

In Column 4, Line 18, delete "quantities." and insert -- quantities, --, therefor.

In Column 4, Line 20-21, delete "magnetizations)." and insert -- magnetization), --, therefor.

In Column 5, Lines 52-55, delete "$0 = (1-m)r - mc\dfrac{k}{1+\left(\dfrac{k}{wl}\right)^2}$" and insert -- $0 = (1-m)r - mc\dfrac{k}{1+\left(\dfrac{k}{wl}\right)^2}$ --, therefor.

In Column 6, Lines 2-5, delete "$0 = (1-m)roc - m\dfrac{k}{1+\left(\dfrac{k}{wl}\right)^2}$" and insert -- $0 = (1-m)roc - m\dfrac{k}{1+\left(\dfrac{k}{wl}\right)^2}$ --, therefor.

In Column 6, Lines 26-27, delete "$-\dfrac{m\,wl^2 + \sqrt{wl^2(-4(-1+m)^2 roc^2 + m^2 wl^2)}}{2(-1+m)roc}$ and" and insert -- $-\dfrac{m\,wl^2 + \sqrt{wl^2(-4(-1+m)^2 roc^2 + m^2 wl^2)}}{2(-1+m)roc}$ and --, therefor.

In Column 6, Lines 28-29, delete "$\dfrac{-m\,wl^2 + \sqrt{wl^2(-4(-1+m)^2 roc^2 + m^2 wl^2)}}{2(-1+m)roc}$" and insert -- $\dfrac{-m\,wl^2 + \sqrt{wl^2(-4(-1+m)^2 roc^2 + m^2 wl^2)}}{2(-1+m)roc}$ --, therefor.

In Column 6, Equation 10, Lines 58-59, delete "$0 = (1-m)r - mc\,duty\dfrac{k}{1+\left(\dfrac{k}{wl}\right)^2} - m\dfrac{1-\cos(flip)}{TR}$" and insert -- $0 = (1-m)r - mc\,duty\dfrac{k}{1+\left(\dfrac{k}{wl}\right)^2} - m\dfrac{1-\cos(flip)}{TR}$ --, therefor.

CERTIFICATE OF CORRECTION (continued)
U.S. Pat. No. 7,610,077 B2

In Column 6, Equation 10, Lines 62-63, delete "$= (1-m)r - mcdu t_y \dfrac{k}{1 + \left(\dfrac{k}{wl}\right)^2} - mrt_rf$" and insert -- $= (1-m)r - mcdu t_y \dfrac{k}{1 + \left(\dfrac{k}{wl}\right)^2} - mrt_rf$ --, therefor.

In Column 7, Equation 11, Lines 7-9, delete "$k^2 = \dfrac{(ma - mb)rwla^2 wlb^2}{r(-ma\,wla^2 + mb\,wlb^2) + ma\,mb(r + rt_rf)(wla^2 - wlb^2)}$" and insert -- $k^2 = \dfrac{(ma - mb)rwla^2 wlb^2}{r(-ma\,wla^2 + mb\,wlb^2) + ma\,mb(r + rt_rf)(wla^2 - wlb^2)}$ --, therefor.

In Column 7, Line 33, delete "assumed." and insert -- assumed -- , therefor.

In Column 9, Line 26, delete "$B_o$in" and insert -- $B_o$ in -- , therefor.

In Column 11, Lines 6-51, delete "FIG.5 shows......rtrf value 645".

In Column 13, Line 23, in Claim 5, delete "nc" and insert -- r/c -- , therefor.

In Column 14, Line 4, in Claim 7, delete "value;" and insert -- value, -- , therefor.

In Column 15, Line 63, in Claim 15, delete "value;" and insert -- value, -- , therefor.